United States Patent [19]

Richman

[11] Patent Number: 4,843,515
[45] Date of Patent: Jun. 27, 1989

[54] SURGE UNDERSHOOT ELIMINATOR

[75] Inventor: Peter L. Richman, Lexington, Mass.

[73] Assignee: KeyTek Instrument Corp., Wilmington, Mass.

[21] Appl. No.: 86,895

[22] Filed: Aug. 18, 1987

Related U.S. Application Data

[63] Continuation-in-part of Ser. No. 40,320, Apr. 20, 1987, abandoned.

[51] Int. Cl.⁴ .............................................. H02H 9/00
[52] U.S. Cl. ..................................... 361/58; 361/111; 324/509
[58] Field of Search ....................... 361/29, 23, 56–58, 361/90–92, 110, 111, 118, 119, 126; 324/158 D, 110, 509

[56] References Cited

U.S. PATENT DOCUMENTS

| | | | |
|---|---|---|---|
| 3,099,789 | 7/1963 | Perrins | 361/58 |
| 3,601,632 | 8/1971 | Frazier | 361/56 X |
| 4,191,986 | 3/1960 | Huang et al. | 361/111 X |

Primary Examiner—Todd E. Deboer
Attorney, Agent, or Firm—Schiller, Pandiscio & Kusmer

[57] ABSTRACT

Disclosed is improved apparatus for applying a test electrical surge from a surge generator to equipment under test. The apparatus includes a coupler/filter that comprises an inductor in each leg of the input power line. In order to dissipate the energy stored in the inductors as the result of a unidirectional test surge, and thereby prevent damage from undershoot to the equipment under test, the apparatus includes high voltage rectifiers across the inductors.

24 Claims, 6 Drawing Sheets

SURGE UNDERSHOOT ELIMINATOR

This application is a continuation-in-part of copending United States Patent Application Ser. No. 040,320, filed Apr. 20, 1987 now abandoned.

This invention relates to electronic test equipment, and more particularly to electronic equipment for minimizing undershoot following unidirectional spike test surges or impulses applied to Equipment Under Test (EUT) by a surge generator.

Surge testing generators are used to provide open-circuit voltage peaks in excess of 6 KV and short-circuit current peaks as high as 10 KA, for application to power, data and other lines to simulate induced or even direct lightning effects, as well as inductive-device switching transients. Such surges are provided generally as unidirectional, exponentially decaying voltage and current pulses with durations of typically 50 microseconds for voltage and 20 microseconds for current. Such surges are ordinarily generated for both polarities.

The term "open-circuit surge voltage" is herein intended to mean that voltage appearing at the surge generator output at which the EUT will be attached for test purposes, but before the EUT is so attached. The term "short-circuit surge current" as used herein is intended to mean (where the EUT is replaced by a short circuit) the current that would flow from the surge generator into that short circuit.

The magnitude of the desired peak open-circuit surge voltage typically ranges from 3 to 6 KV from surge testing generators intended for industrial and residential power-line applications. For the same applications, peak short-circuit surge current magnitudes range from 125 A to 10 KA.

With the advent of computers and related electronic equipment, it has become necessary, for test purposes, to apply these high-voltage, high-current surges to the AC power line input of the EUT. Adequate surge suppression can be assured in the design of equipment such as computers and microprocessor-based electronics, only by surge testing at the AC power line input during design, production and quality assurance phases of manufacture. Without such suppression and thorough verification of its effectiveness, modern, sensitive electronics will often fail in service when subjected to surges due to induced or direct lightning or to power line inductive surges caused by switching of motors, compressors and relays.

Such test surges should be applied to the EUT while normal AC line power is normally supplied to the EUT from conventional AC power furnished by the local power company. Otherwise, the test will not realistically represent conditions under which the EUT will operate in actual service. Such simultaneity of input power and test surge is desirable so that the susceptibility of the EUT for malfunction or upset during the surge can be judged while the EUT is fully operating. Also, one of the most damaging aspects of power-line surges arises because although the high-voltage, high-current surge may only contain limited energy, it can ionize a path in air or generate a tracking path across an insulator or by high-voltage flashover. The power line with its large continuous power capability can use the ionized or tracking path to supply heavy line current to the location at which the high-voltage fault has occurred. This effect is termed "power follow". Some high-voltage flashovers are at such a low energy level that in the absence of AC line power, the effect of a single flashover on the EUT may well go undetected during testing. Surge testing with AC line power applied will permit power follow to expose the weak spot in the EUT design with substantial certainty.

It is not possible, however, simply to surge the AC line input to the EUT. Any such surge would travel along the line to other line-powered equipment and might cause extensive damage since not all equipment is surge-protected, or surge-protected to the same level. Also, if another piece of equipment on the same power line as the EUT does in fact incorporate surge protection, the latter (which often takes the form of components that shunt a low impedance across the line during the surge) may protect the EUT as well. Such inadvertently provided protection will mask surge sensitivity that the EUT may possess when operating on an unprotected line.

In addition to the above reasons, unless an impedance is interposed between the test surge generator and the AC power source, the surge generator will have to develop the test surge across the extremely low impedance of the AC power line. To provide the surge would require a test generator having a high drive capability (i.e. low source impedance) that would be one or two orders of magnitude greater than that required for the purpose of testing the EUT, a highly uneconomic and unfeasible approach, and should an EUT short circuit via flashover or insulation break down, the resulting excessive short circuit surge current might well be extremely destructive to the EUT.

For the reasons above noted, the prior art, as shown in FIG. 1, typically interposes a power line filter 20 between power line 22 and EUT 24 during surge testing. It is also usual to couple surge generator 26 through surge coupler 28 to the EUT power input terminals at the junction of filter 20 and EUT 24. The combination of surge coupler 28 and filter 20, identified by reference numeral 30, is known as a "coupler/filter" and is also referred to as a "coupler/decoupler" since the filter in effect decouples the surge from the AC power line. The coupling is shown for exemplary purposes, in so-called normal, or line-to-line mode in which ground is not involved. Common mode couplers are also known prior art configurations, the term common mode as used herein being intended to refer to any coupling of the test surge between ground and one or more power lines, including neutral. Filter 20 must, of course, pass AC line power essentially unchanged. Simultaneously, filter 20 must also block most of the surge from travelling to power line 22. In addition, filter 20 must present to test surge generator 26 an impedance having a value that is both reasonable and suitable for the development of the typically 3–6 KV peak, 50-microsecond duration test open-circuit surge voltage.

Line filter 20 usually comprises inductors and capacitors and sometimes resistors. An exemplary schematic of a typical coupler/filter 30 is shown in FIG. 2, again for a normal mode. The circuit of FIG. 2 includes a pair of inductors 32 and 34, each series connected respectively to the high and low sides of AC line 22, capacitors 36 and 38 respectively connected between the high and low sides of line 22 and ground, and capacitor 40 connected between the high and low sides of line 22. Surge coupler 28 may employ various devices for the coupling purpose, but is shown in FIG. 2, as being formed of a single, surge-rated capacitor 42. Such configuration is the most common for power lines. Other couplers may include devices that only conduct during or at approximately the same time as the surge: gas breakdown devices, silicon surge diodes, metal oxide varistors and the like. In some circumstances all that is required is a direct connection.

Conventional surge generators, when used in conjunction with the conventional surge coupler/filters used to simultaneously apply AC power to an EUT, often exhibit large voltage undershoots (or backswings or ringbacks) due primarily to energy deposited in inductors 32 and 34 by the test surge. Alternatively, if the filter includes only a single inductor (typically in series in the high side as exemplified by a transformer secondary coil used to couple the surge into the EUT), such single inductor may experience the same deposition of energy during the surge and therefore yield a subsequent undershoot. This causes no problem with many surge protectors traditionally used at the point of power entry of the EUT. Newer protectors, however, with tighter surge clamping voltages and employing more sensitive protectors, such as silicon semiconductors, often in multiple stages coupled to one another through appropriate impedances internally, can fail due to the undershoot, although they may have no problem withstanding and clamping the test surge itself. Depending upon the circuit configuration, in some modern protectors undershoot energy during test can be as much as 5 to 10 times forward energy. The undershoot duration is a function of the impulse response of the coupler/filter, and thus tends to be much longer than the surge itself, usually by at least hundreds of microseconds and possibly even milliseconds. FIG. 3 graphically illustrates a typical voltage impulse provided by a test surge generator not connected to a coupler/filter, the amplitude of the wave dropping exponentially from about 6 kV toward zero in about 250 microseconds. FIG. 4 on the other hand shows the output wave from the same test surge generator when the latter is connected to a coupler/filter. In the latter instance, the effect of the coupler/filter on the waveform from the generator results in an undershoot of about $-1.7$ kV, not present in the original waveform. If the surge shown in FIG. 4 is connected across a conventional metal oxide varistor used at the input of a typical EUT for surge suppression, the wave clamps and then undershoots for a duration extremely long compared to the surge itself. The varistor only absorbs typically about half as much energy in the reverse direction as in the forward direction, since the clamping voltage of the varistor is so high (i.e. on the order of 400 to 500 volts in both directions). A more elaborate protector coming into increasing use is a multistage unit in which the final stage is a silicon, semiconductor device clamping tightly at about 270-280 volts. Unlike the metal oxide varistor, the output semiconductor is less overload-tolerant and clamps at a lower voltage than the varistor, and because of its critical location within the protector circuit, is subjected to a current due to which the reverse energy is, for example 6 to 8 times the forward energy. Thus the semiconductors regularly fail during surge testing while not failing in actual service.

A principal object of the instant invention is to minimize surge undershoot in surge generator operation, in part, or to eliminate it completely, by choice.

The principal object of the present invention is effected by providing diode or rectifier clamping in connection with one or more inductances such as filter chokes in the coupler/filter, the normal voltage across said chokes, due to power line current, being low to insure normal EUT operation, i.e., there should be no significant change in AC input voltage to the EUT with or without the coupler/filter. Such rectifier clamping, poled appropriately for each surge application (an application choice consisting of surge polarity, surge mode: common or normal, and the location of the inductances), or automatically poled by design, can virtually completely eliminate the surge undershoot without affecting the normal AC line voltage or current supplied to the EUT, or the open-circuit surge voltage or short-circuit surge current applied to the EUT during the test.

For applications in which high AC currents flow into the EUT, whether sinusoidal or spike in character, several rectifiers (often as many as fifteen or more rectifiers or zener diodes or combination of both) can be used to replace a single clamp rectifier across each inductance. A drop of a few volts across the inductance due to normal EUT AC power line current, or even a few tens of volts, can be handled in this manner. Undershoot will then be a few volts or a few tens of volts accordingly, trivial in either case, in the application. Undershoot generally has to approach one or two hundred volts to cause a problem, even with the more sensitive protectors.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims. For a fuller understanding of the nature and objects of the present invention, reference should be had to the following detailed description taken in connection with the accompanying drawings wherein:

Figure 16:
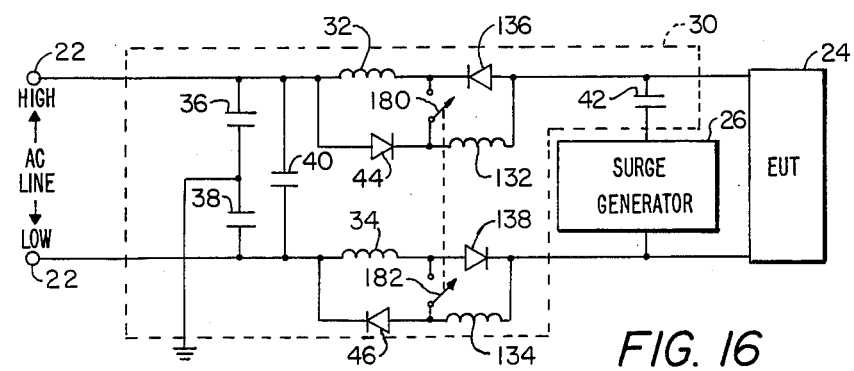
FIG. 16 is yet another circuit schematic, partly in block form, of an alternative embodiment to FIG. 15.
Figure 17:
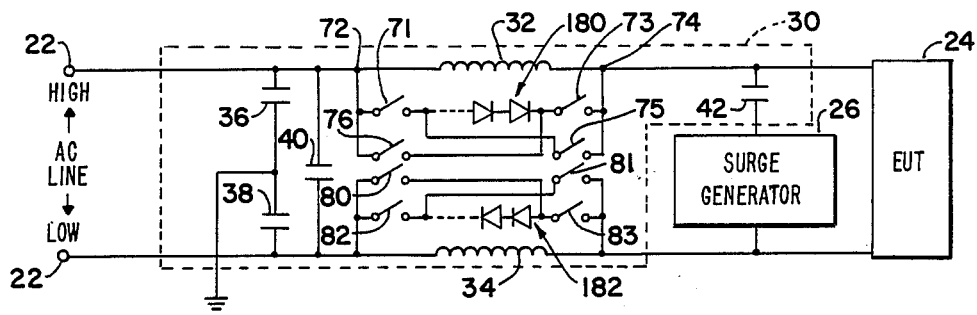
FIG. 17 shows a variant of the circuit of FIG. 7 in which the rectifier means is a series-string of rectifiers.
Figure 18:
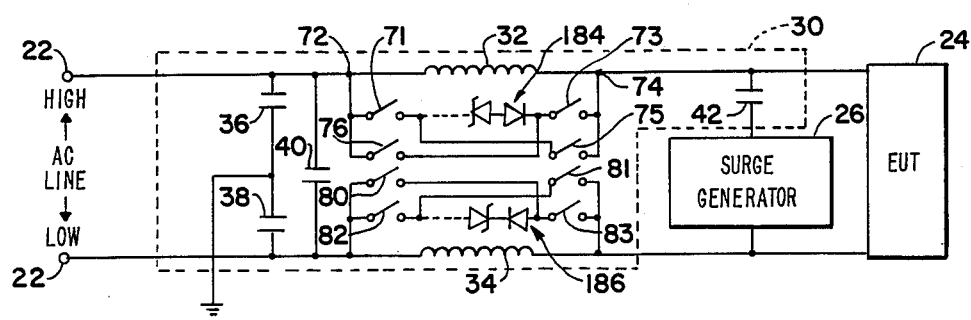
FIG. 18 shows another variant of the circuit of FIG. 7 in which the rectifier means is a series-string of zener diodes and at least one rectifier.

In all embodiments of the invention shown in FIGS. 5 to 18 inclusive, the rectification devices are delineated for simplicity as single rectifiers, but it is to be understood that, in the preferred embodiments, unless otherwise indicated such rectification devices may be formed of series strings of several rectifiers or zener diodes or combinations of both as exemplified particularly by FIGS. 17 and 18.

Figure 1:
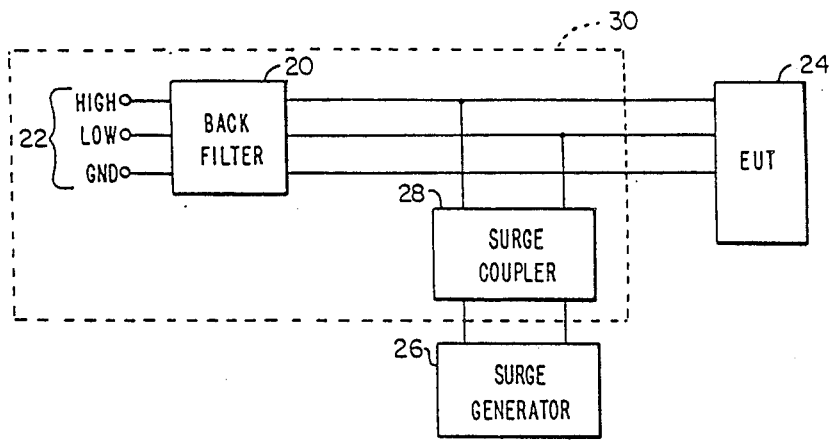
FIG. 1 is a block diagram of the prior art coupling of a surge generator, equipment under test and a coupler/filter arrangement.
Figure 2:
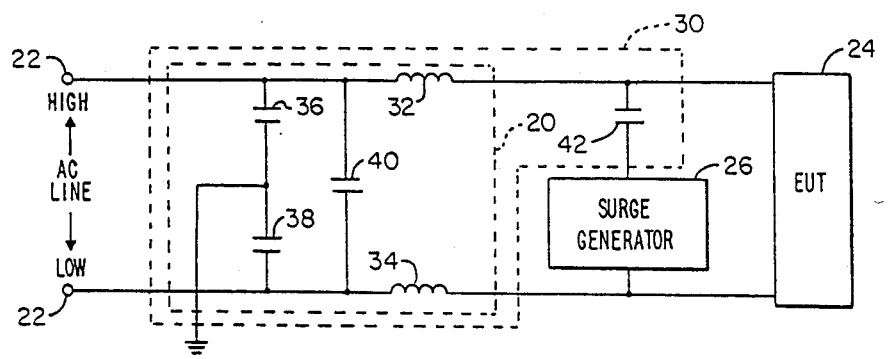
FIG. 2 is an idealized circuit schematic, partly in block form, of the embodiment of FIG. 1.
Figure 3:
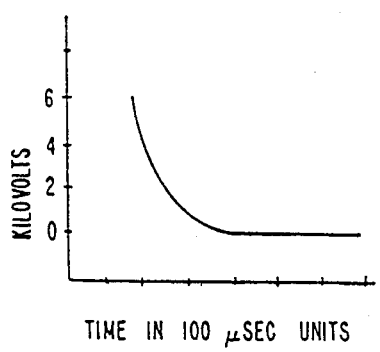
FIG. 3 is an amplitude/time graph of a typical voltage impulse provided by a test surge generator not connected to a coupler/filter.
Figure 4:
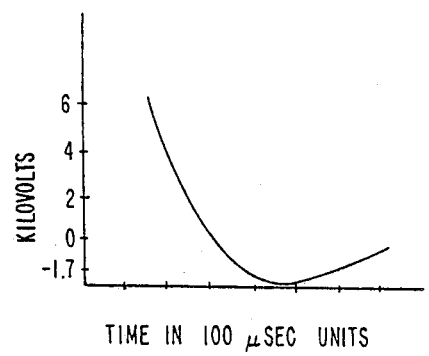
FIG. 4 is an amplitude/time graph of the same test surge generator used to produce FIG. 3, when that generator is connected to a coupler/filter.
Figure 5:
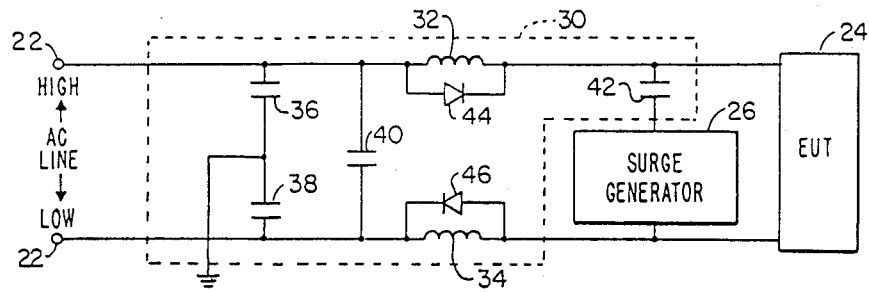
FIG. 5 is a circuit schematic, partly in block form, embodying the principles of the present invention.

Referring now to the drawings, in which like numerals denote like parts, it will be seen that the embodiment of the invention shown in FIG. 5 includes substantially the same elements as the prior art system shown in FIG. 2, but one that provides undershoot suppression or elimination for single phase, normal mode, positive polarity surge operation. Undershoot suppression in the present invention is achieved by adding means for dissipating at least the major portion of energy stored in the filter chokes by virtue of a power surge provided by the surge generator, thereby preventing application of the stored energy to the equipment under test. Such means are preferably provided as a pair of rectifiers 44 and 46 respectively connected across filter chokes or inductors 32 and 34. Rectifiers 44 and 46 are high voltage rectifiers since each can be expected to support typically a full 3 to 6 Kv surge peak during testing. It should be noted that rectifiers 44 and 46 are poled oppositely to one another and in such a manner that they will withstand a forward surge of positive polarity provided by surge generator 26. Note that the rectifiers thus will clamp a reverse surge. Thus, energy stored in the two inductors 32 and 34 during application of the test surge cannot exit from the chokes except into the rectifiers where the energy is dissipated. Any energy stored in the capacitors in the circuit will be rapidly dissipated (in microseconds) into the extremely low, low frequency impedance of the power line to which they are connected.

It will be appreciated that in the embodiment of FIG. 5, the polarities of rectifiers 44 and 46 can be reversed to provide undershoot suppression for single phase, normal mode, negative polarity surge operation. In such instance, the rectifiers would operate in the same manner as in FIG. 5, but with respect to a reversed polarity of the surge and subsequent undershoot.

Figure 6:
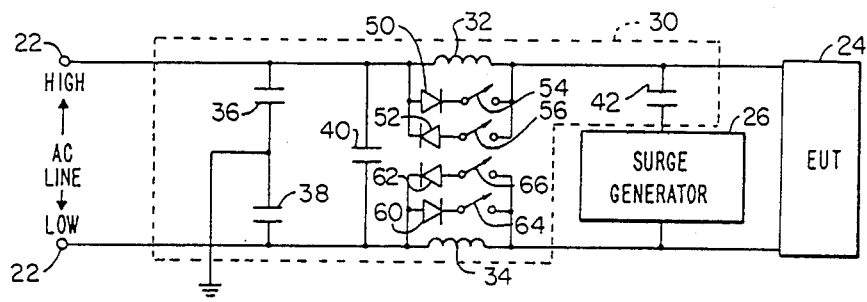
FIG. 6 is a circuit schematic, partly in block form, of another embodiment of the present invention.

FIG. 6 illustrates an embodiment of the present invention that will provide undershoot elimination for single phase, normal mode, selectable surge polarity operation using a surge generator that is controllable to provide a surge of either polarity as desired. To this end, the embodiment of FIG. 6 incorporates all of the elements of FIG. 2, but adds a first pair of high voltage rectifiers 50 and 52 oppositely poled from one another and connectable across filter choke 32 by respective single pole, single throw switches 54 and 56. Similarly, another pair of high voltage rectifiers 60 and 62, oppositely poled from one another, are mounted so as to be connectable across filter choke 34 respectively by switches 64 and 66. Switches 54, 56, 64 and 66 may be manual switches or may be relays. In the latter instance, the relays preferably should operate from the same controls that are used to perform polarity selection with respect to surge generator 26. In a preferred embodiment, switches 54, 56, 64 and 66 are ganged for operation so that if switch 54 is closed, then switch 66 must also be closed and switches 56 and 64 are open. Alternatively, if switch 54 is open, then switch 66 must also be open and switches 56 and 64 are closed. It will be appreciated that when switches 56 and 64 are open and switches 54 and 60 are closed, the embodiment of FIG. 6 operates in the same manner as that of FIG. 5. Alternatively, reversing these switch settings will result in the embodiment of FIG. 6 operating in the same manner as the negative surge version of FIG. 5.

Figure 7:
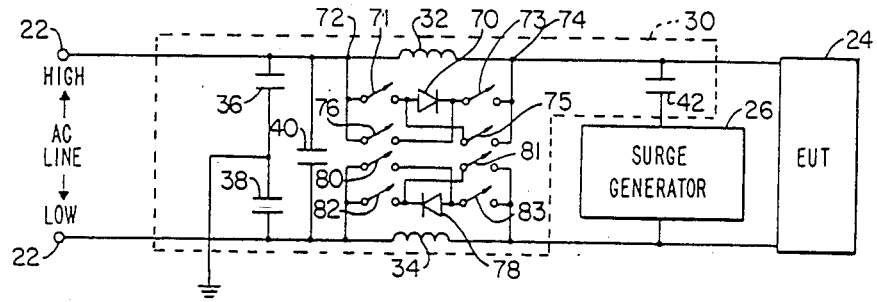
FIG. 7 is a circuit schematic, partly in block form, showing yet another alternative embodiment of the present invention.

FIG. 7 shows an alternative switching configuration serving the same purpose as the system of FIG. 6. In FIG. 7 a single high voltage rectifier 70 is provided, its anode being connectable through switch 71 to terminal 72 connected to one side of filter choke 32. The cathode of rectifier 70 is connectable through switch 73 to terminal 74 connected to the other side of choke 32. Another pair of switches is also provided in the form of switch 75 which when closed serves to connect the anode of rectifier 70 to terminal 74, and switch 76 which when closed serves to connect the cathode of rectifier 70 to terminal 72. High voltage rectifier 78, poled oppositely to rectifier 70, is connectable across filter choke 34 by four switches, 80, 81, 82 and 83 couplable to rectifier 78 and choke 34 in the same manner as switches 71, 73, 75 and 76 connect rectifier 70 across choke 32. It will be immediately apparent that the operation of FIG. 7 can duplicate that of FIG. 6. However, the embodiment of FIG. 7 requires four high voltage switches or relays for each inductor instead of the two switches for each inductor used in the embodiment of FIG. 6. Since high-voltage switches and relays may be more expensive than high-voltage rectifiers, the approach embodied in FIG. 6 may be preferred from a cost standpoint.

Figure 8:
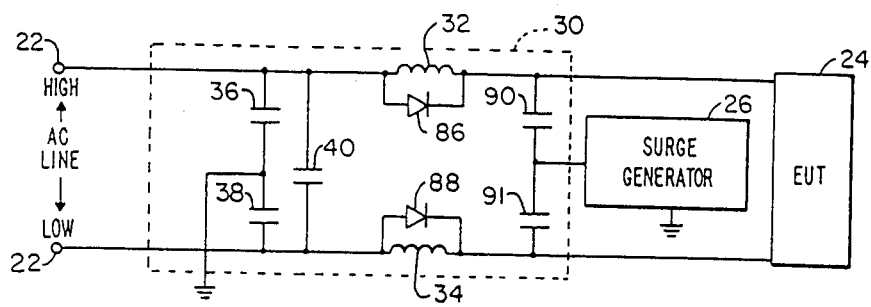
FIG. 8 is a circuit diagram, partly in block form, of yet another alternative embodiment of the present invention.

The principles of the present invention are readily embodied in the alternative structure shown in FIG. 8 which is intended to provide undershoot elimination for single phase, common mode, positive surge polarity. In FIG. 8, high voltage rectifier 86 is connected across choke 32 and high voltage rectifier 88 is connected across choke 34. Both rectifiers 86 and 88 are poled in the same direction, i.e. with the anodes connected respectively to the high and low input terminals of power line 22, and their cathodes respectively connected to the high and low inputs of EUT 24. A pair of capacitors 90 and 91 are connected respectively between the cathodes of rectifiers 86 and 88. Surge generator 26 is connected between ground and the junction of capacitors 90 and 91. A variation of FIG. 8, to obtain undershoot elimination for single phase, common mode, negative surge polarity, simply requires reversal of the polarity of high voltage rectifiers 86 and 88. It will be apparent that in the embodiment of FIG. 8, the rectifiers are poled according to both the desired surge mode and the surge polarity.

Figure 9:
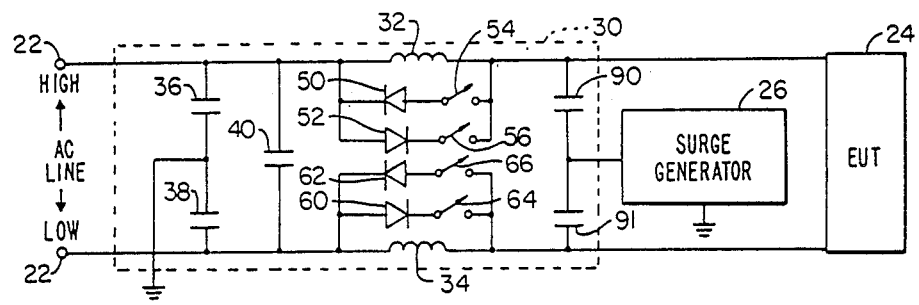
FIG. 9 is a circuit schematic, partly in block diagram, of another alternative form of the present invention.
Figure 10:
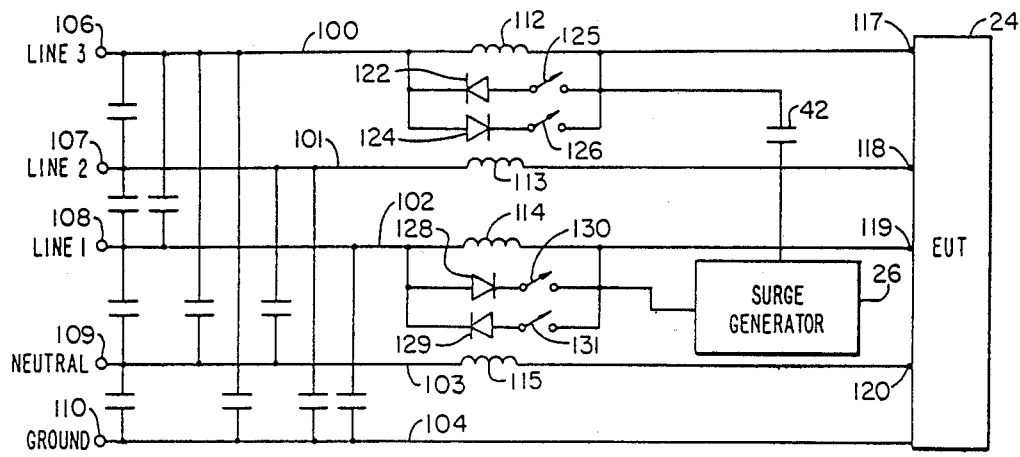
FIG. 10 is a circuit schematic, partly in block form, of another embodiment of the invention applicable particularly to a three phase system.

In a more general version of a system for undershoot elimination in single phase, common mode operation, the embodiment of FIG. 9 is quite similar to that of FIG. 8 except that choke 32 is bridged by a pair of high voltage rectifiers 50 and 52 oppositely poled to one another, each being connectable across choke 32 by operation of respective switches 54 and 56. It will be recognized that the arrangement of high voltage rectifiers and switches is substantially identical to that shown in FIG. 6, but the version of FIG. 9 provides common mode operation with selectable surge polarity by virtue of the connection of surge generator 26 between ground and the junction of capacitors 90 and 91 as in FIG. 8. As in FIG. 6, of course, choke 34 is bridged by the combination of rectifiers 60 and 62 and their respective associated switches 66 and 64. Note that each rectifier is poled across its associated inductor so that the positive polarity output from the surge generator always connects through a coupling capacitor to a cathode and the negative polarity output from the surge generator always connects through the coupling capacitor or other coupling means to an anode, all, of course, depending upon the switches being connected and disconnected in appropriate combinations.

The general embodiment of FIG. 9 can be readily extended to a full three phase, five wire system. The embodiment shown in FIG. 10 includes a coupler/filter for a three-phase, five-wire power line exemplified by conductors 100, 101 and 102 for carrying the three phase-separated electrical power components, conductor 103 as the neutral line and conductor 104 as ground. Conductors 100, 101, 102 and 103 respectively connect line input terminals 106, 107 108, and 109 to the input ends of corresponding inductors 112, 113, 114 and 115 connected in respective conductors. As is typical of three-phase coupler/filters, filter capacitors are provided to connect the input terminal of each conductor to the input terminal each and every other conductor. The output ends of inductors 112, 113, 114 and 115 are connected to corresponding input terminals 117, 118, 119 and 120 at EUT 24. One side of surge generator 26 (preferably capable of selectively poled surge generation) is coupled through coupling capacitor 42 to the junction between inductor 112 and input terminal 117, the other side of the surge generator being connected to the junction of inductor 114 and input terminal 119. A pair of oppositely poled rectifiers 122 and 124 are connectable through switches 125 and 126 respectively across inductor 112. Preferably, switches 125 and 126 are ganged so that they are operable in a mutually exclusive manner, thus insuring that only one rectifier at any time is connected across inductor 112. Similarly, another pair of oppositely poled rectifiers 128 and 129 are connectable through mutually exclusively operable respective switches 130 and 131 across inductor 114. It will be appreciated that the embodiment of FIG. 10 in operation will provide undershoot minimization or elimination for three-phase, line to line operation between any two lines including neutral, with the surge polarity selectable according to the settings of the polarity of surge generator 26 and switches 125, 126, 132 and 131.

Figure 11:
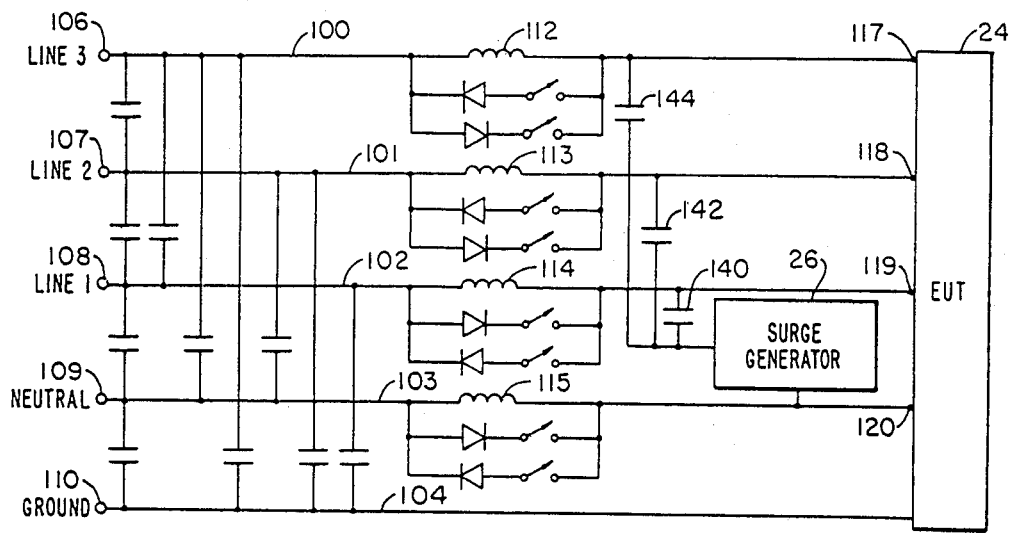
FIG. 11 is another circuit schematic, partly in block form, of an alternative embodiment of the present invention for a three phase system.

An alternative embodiment of a surge undershoot eliminator for a three-phase system for surging three lines to neutral, with selectable surge polarity, is shown in FIG. 11. The circuit of FIG. 11 is formed with the same coupler/filter as that of FIG. 10, but each of inductors 112, 113, 114 and 115 has a respective pair of oppositely poled rectifiers connectable across it, each rectifier having an associated switch operable to connect or disconnect that particular rectifier around its associated inductor. In all cases, preferably the switches connected with each pair of rectifiers are mutually exclusively operable so that regardless of which of a pair of switches is closed, the other switch of that pair must be open. Also, in the preferred embodiment, all switches are also connected so that the rectifiers connected across the inductors at any time are all of the same polarity. It will be seen that surge generator 26, preferably operable to provide an output of either desired polarity, has one side connected to terminal 120. The other side of surge generator 26 is connected through coupling capacitor 140 to the junction of inductor 114 and input terminal 119, through coupling capacitor 142 to the junction of inductor 113 and input terminal 118, and through coupling capacitor 144 to the junction of inductor 112 and respective input terminal 117.

Figure 12:
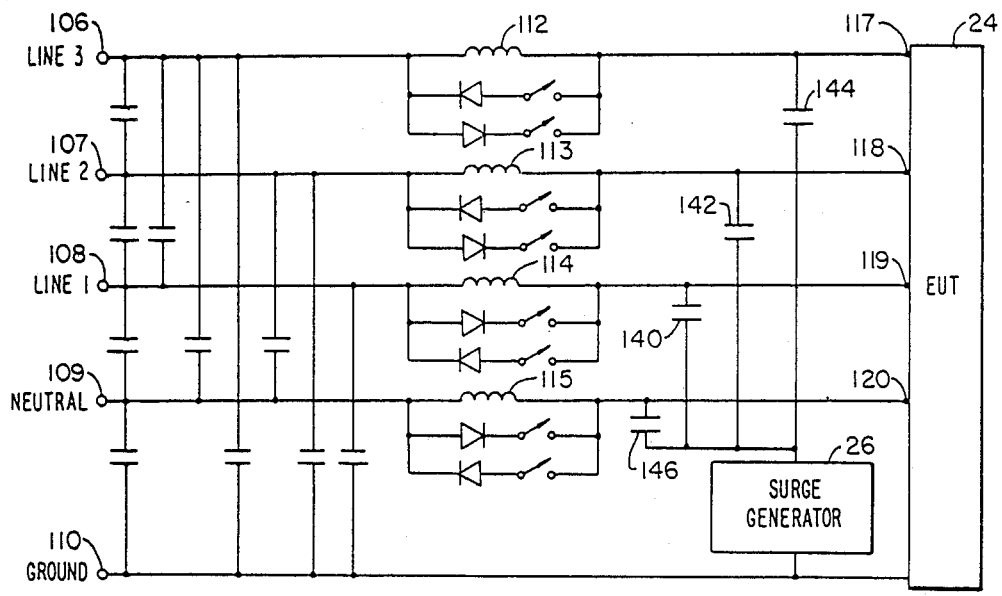
FIG. 12 is a circuit schematic, partly in block diagram, of an embodiment of the present invention showing yet another alternative for three phase systems.

The embodiment shown in FIG. 12 is intended to provide undershoot elimination for a three-phase system, three lines and neutral to ground, preferably with selectable surge polarity. The embodiment of FIG. 12 includes the same coupler/filter as that of FIG. 10, and each of inductors 112, 113, 114 and 115 has a respective pair of oppositely poled rectifiers and associated switches connectable across it as in FIG. 11. Surge generator 26, preferably operable to provide an output of either desired polarity, has one side connected to ground conductor 104, the other side of surge generator 26 being connected through coupling capacitors 140, 142, 144 and 146 respectively to terminals 119, 118, 117 and 120.

It will thus be apparent that, for a three phase system in common mode configuration, one can couple the surge generator in a large number of ways, generally between ground and each or any of the other conductors, or in normal mode, between at least any two conductors.

It will be apparent that certain changes may be made in the embodiments of FIGS. 5-12 as thus described, without departing from the scope of the invention herein involved. For example, switching may be required to provide proper disposition of a rectifier across an inductor according to the polarity of the surge, the coupling mode and the location of the inductor in the circuit; the purpose of such disposition is to insure that no current will flow through the rectifier due to the surge during the surge. Generally then, one has two basic choices or types of circuitry: (1) to use, as in FIG. 6, two rectifiers and two relays or switches for each inductor, or (2) to use, as in FIG. 7, one rectifier and four relays or switches for each inductor. Thus, it will be immediately appreciated that any circuit of one of these types shown or described herein may be replaced with the circuit of the other type. The major considerations in making such choice are cost and space limitations.

It should be understood that some surge generators generate only unidirectional surges (referred to hereinafter as impulse waves), but others generate damped oscillatory waves (referred to hereinafter as ring waves), while still others are used to generate both impulse and ring waves. A paradox inherent in undershoot elimination is that not only is undershoot elimination unecessary in the case of ring waves, but it may be actually detrimental, because what is an undesirable undershoot with respect to a supposedly unidirectional impulse wave, forms in fact a necessary part of an oscillatory or ring wave. Thus, two basically different undershoot-eliminator designs appear desirable to cover the field of surge generators generally, when such generators are equipped or used with coupler-filters. One usually simpler design, such as those described in connection with FIGS. 5 and 8, will suffice for generators that produce only unidirectional impulses. A second, somewhat more complicated and expensive design, such as those described in connection with FIGS. 6, 7, and 9-12, can be provided for generators that provide capability for user selection between ring and impulse wave surges; for example, each of these embodiments will in essence be the same as that of FIG. 2 if all of the associated switches are opened at the same time. An undershoot eliminator that works well for an impulse wave may distort a ring wave in varying amounts, depending upon the eliminator design and on the characteristics, including the frequency and output impedance, of the ring wave generator. For these reasons the various implementations of the present invention described hereinafter in connection with FIGS. 13-16 will be accompanied with an indication of applicability either to impulse-type surge generators or impulse-and-ring surge generators.

Figure 13:
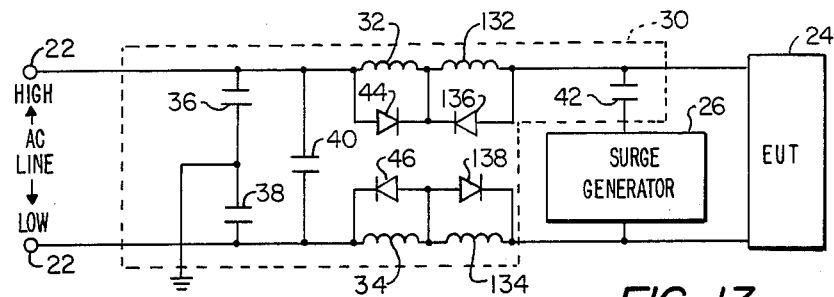
FIG. 13 is a circuit schematic of an alternative polarity-insensitive form of the present invention.

The implementation of FIG. 13, shown for exemplary purposes for a single-phase power line and normal-mode surge coupling, incorporates all of the elements of FIG. 5 and adds another inductor 132 in series with inductor 32, and another inductor 134 in series with inductor 34. Rectifier 136 is connected in series with rectifier 44 with like electrodes connected to one another and to the junction of inductors 32 and 132. Similarly, rectifier 138 is connected in series with rectifier 46 with like electrodes being connected together and to the junction of inductors 34 and 134. Each of the inductors of a series-connected pair are thus paralleled with a corresponding high-voltage, high-current rectifier, the rectifiers being in opposing polarities for the corresponding series inductors. Note that in operation, substantially all of the positive input current will pass through one inductor of each pair of series-connected inductors, and substantially all of the negative input current will pass through the other inductor of each associated pair of inductors.

Importantly, unlike the embodiments of FIGS. 5 to 12 inclusive, the configuration of FIG. 13 is not surge-coupling mode or surge-polarity dependent, or surge character (i.e. impulse or ring wave) dependent. Thus, the embodiment of FIG. 13 can also be applied to three-phase as well as single phase, in any surge coupling mode, and for oscillatory as well as unidirectional surges, all of which provides huge savings in switching and complexity over the implementations of FIGS. 5-12. For this and other reasons, as set forth hereinafter, this configuration is a preferred form of the invention and is particularly useful with impulse-type surge generators.

Additional advantages of the circuit of FIG. 13 are multitudinous. For example, the structure of FIG. 13 still insures that dumping (through the relevant rectifier) of energy stored in any of the filter inductors due to the surge, will occur immediately after the surge thereby eliminating or significantly reducing the undershoot that such energy would otherwise produce. The embodiment of FIG. 13 also eliminates the excessive short-circuit rectifier current that flows for a shorted load in the implementations of FIGS. 5-12, which current demanded the use of very high-surge-current, extremely expensive rectifiers in those implementations. In the embodiment of FIG. 13, there are always two inductors still in series with the rectifiers called upon to carry such short-circuit currents, thereby insuring peak rectifier currents (in load short circuit situations) only of the order of 120 A rms or less for 120 V rms power lines, for example.

Another advantage of the embodiment of FIG. 13 lies in the fact that the forward voltage drop across each rectifier is no longer required to exceed the normal power-line current-induced voltage drop across its associated inductor, since the other inductor which which each is in series is at full impedance. Hence full voltage drop due to power-line current does not arise (the associated rectifier being non-conducting) until the line surge occurs. Consequently, far fewer actual rectifiers must be used in series to implement each of the rectifiers shown as single units (for the sake of simplicity) in the drawings. Now, the back voltage of each such series string of rectifiers has only to withstand the peak surge voltage, while the combined voltage drop across the string no longer has to exceed the line-current-generated voltage across the choke. The embodiment of FIG. 13 has yet a further advantage of causing the same current, due to power follow during the half cycle in which the surge takes place, as in subsequent half cycles. Note that there are two chokes in the circuit even during that half-cycle, while in the implementations of FIGS. 5-12, all relevant chokes are shunted by rectifiers.

The embodiment of FIG. 13 however, does introduce some distortion in the vicinity of zero volts for ring waves that have oscillatory frequencies in the tens of KHz and higher, and surge generator output impedances in the tens of ohms. For example, while the design of FIG. 13 is acceptable for practical purposes for use with a 1 KHz ring-wave generator, it introduces what appears to be a small amount of crossover distortion at 100 KHz, a popular frequency for ring wave surges. This apparent crossover distortion takes the form of a wave that remains zero for a few degrees or tens of degrees after reaching crossover, before it again departs from zero to begin its next sine wave at ring wave frequency. This distortion apparently arises from the fact that at the end of each ring wave half cycle, energy stored in the inductor that is conducting during that half cycle, dumps into, and hence cause conduction in, not only the rectifier that parallels that inductor, but also the rectifier that parallels the other inductor. One of the two rectifiers will of course stop conducting when the ensuing, opposite polarity half cycle of the ring wave voltage creates an opposing inductor current that equals the now-decayed current in the inductor that is holding both rectifiers on. During the time that both rectifiers are on, they thus impose what in effect is a short circuit across the ring wave surge generator output applied to the EUT, since the impedance seen by the power line is so low compared to the typical ring wave surge generator output impedance of several tens of ohms.

Figure 14:
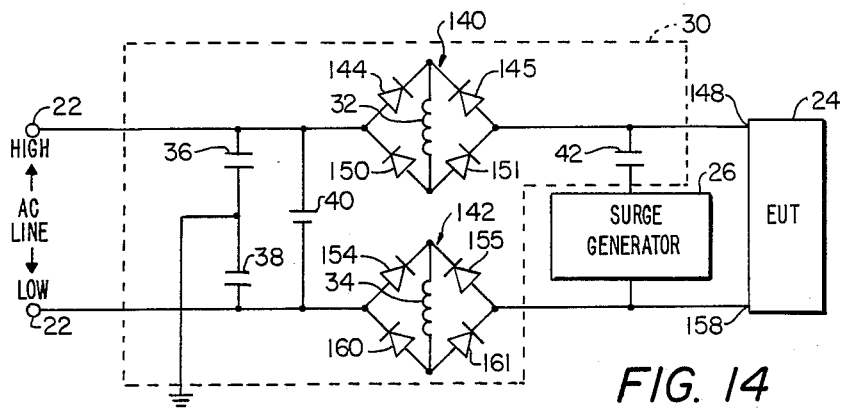
FIG. 14 is a circuit schematic, partly in block form, of yet another polarity-insensitive form of the present invention.

Another preferred embodiment of the present invention, particularly for use with impulse-only wave generators, is shown in FIG. 14 and includes two bridges, 140 and 142, respectively connected in the high and low sides of the circuit. Bridge 140 is formed of two rectifiers 144 and 145 connected cathode-to-cathode in series between junctions 146 and 148. A similar pair of rectifiers 150 and 151 are also connected in series between junctions 146 and 148, but anode-to-anode. Inductor 32 is connected across the bridge between the paired cathodes and the paired anodes of the rectifiers. In like manner, bridge 142 includes two series-connected rectifier pairs, rectifiers 154 and 155 being connected cathode-to-cathode between junctions 156 and 158, and rectifiers 160 and 161 being connected anode-to-anode between junctions 156 and 158. Inductor 34 is connected between the paired cathodes and paired anodes of the rectifiers of bridge 142. The remainder of the circuit is the same, as indicated by the same reference numerals, as the corresponding parts of the circuit of the embodiment of FIG. 2. While it appears that four individual rectifiers are required for each bridge, the circuit of FIG. 14 is very economical as compared to other embodiments of the present invention described herein. For example, each rectifier shown in FIG. 13 would be, in a practical embodiment, exemplified by at least two and often as many as six or eight rectifiers in a string, in order to obtain sufficient reverse voltage rating along with surge current handling capability. Thus, in effect each rectifier shown in FIG. 14 can have one half or less than the inverse voltage rating of each rectifier shown in FIG. 13.

The embodiment of FIG. 14 operates essentially in the same manner as that of FIG. 13. No matter which polarity of unidirectional impulse is applied to the terminals, when current flow in the inductor tries to reverse, it will turn on the rectifiers in parallel with the inductors, to remove the inductor's energy without introducing undershoot of more than a few volts due to the series forward drop of the associated rectifiers. The embodiment of FIG. 14 has the same concerns with application of ring wave surge as has heretofore been expressed with respect to the embodiment of FIG. 13; namely, all of the rectifiers are shorted for a time as each half cycle is completed, thereby causing some crossover distortion.

Figure 15:
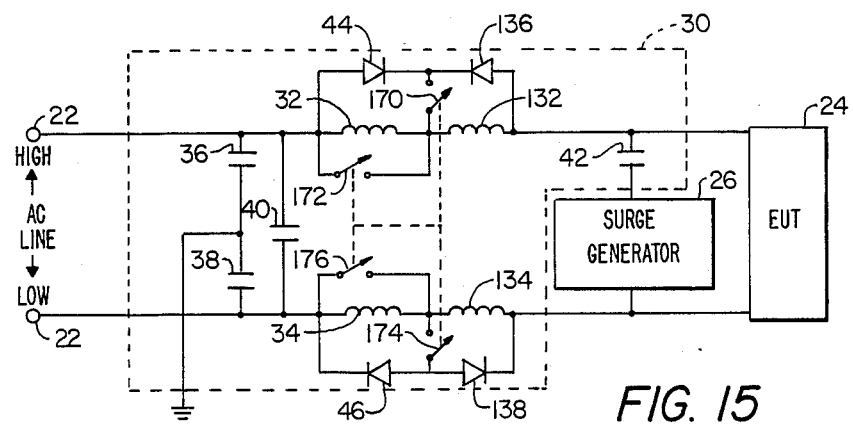
FIG. 15 is a circuit schematic, partly in block form, of another alternative embodiment of the present invention, particularly suitable for use in an impulse-and-ring wave generator.

For generators that produce impulse-and-ring-wave outputs selectively, the circuits of FIGS. 15 and 16 are particularly useful. The embodiment shown in FIG. 15 is a modification of the circuit of FIG. 13, in which switch 170 is provided to connect the junction of inductors 32 and 132 to the coupled cathodes of rectifiers 44 and 136. Switch 172 is also provided in parallel with inductor 32. Similarly, switch 174 is disposed to connect the junction of inductors 34 and 134 to the connected cathodes of rectifiers 46 and 138, and switch 176 is connected in parallel with inductor 34. Switches 170, 172, 174 and 176, which may be relays as well, are preferably mechanically connected or ganged so that when switch 170 is open, switch 174 is also open and switches 172 and 176 are closed, the inverse operation being also true. Hence, when switches 170 and 174 are closed, switches 172 and 176 are open, and the circuit is identical to that of FIG. 13 so is particularly suitable for use with an impulse wave. When switches 172 and 176 are closed and switches 170 and 174 are open, only inductors 132 and 134 are current-carriers, for the oppositely poled rectifiers then act as infinite impedances; the embodiment of FIG. 15 then becomes identical to that of FIG. 2, a circuit that functions well for ring-waves. Note that the functions of switches 172 and 176 are to short circuit their respective associated inductors. Otherwise, two inductors would be in series for ring-wave applications, thereby providing too large a voltage drop due to normal power line current into any given load. Of course, where the double inductance value and the consequent voltage drop can be tolerated, switches 172 and 176 would not be necessary, Lastly, another embodiment particularly useful with impulse-and-ring-wave use is shown in FIG. 16 wherein the position of one of the rectifiers and its associated inductor in each leg or side of the circuit are interchanged compared to FIG. 15.. As shown, inductor 32 is in series with rectifier 136 and inductor 132 is in series with rectifier 44 when switch 180 (positioned between the junction of rectifier 44 and inductor 132 and the junction of rectifier 136 and inductor 32) is open. Similarly, inductor 34 is in series with rectifier 138 and inductor 134 is in series with rectifier 46 when switch 182, positioned to connect or disconnect the junction of rectifier 46 and inductor 134 with or from the junction of rectifier 138 and inductor 34, is open. Switches 180 and 182, which may be relays or the like, are preferably operable together so that both are either opened or closed together. Note that when switches 180 and 182 are both closed the circuit is identical in operation to that of FIG. 13, hence is primarily applicable to impulse wave generators. When switches 180 and 182 are both open, since only one inductor of an associated pair in a leg is in the circuit for only one half cycle of a ring wave as determined by the polarity of the associated rectifier, the effective inductance in each leg is merely that of one inductor. There is then no need of any additional relays such as switches 172 and 176 in FIG. 15, to reduce circuit inductance to the original value. The embodiment of FIG. 16 is thus preferred for combined impulse-and-ring-wave applications since it uses the fewest components and is therefore the most economical.

It will be apparent to those skilled in the art that the principles of the embodiments of FIGS. 13 to 16 can also be extended to polyphase systems in a manner similar to that earlier described herein with respect to other embodiments, for example by employing a requisite inductor/rectifier means in each leg of the system.

FIG. 17 shows the use of series strings of rectifiers, identified by the reference numerals 180 and 182, in place of the single rectifiers of FIG. 7. Similarly, FIG. 18 is an embodiment in which the single rectifiers of FIG. 7 have been replaced with corresponding series strings of rectifiers and Zener diodes identified by the reference numerals 184 and 186. The embodiments of FIGS. 17 and 18 will be recognized as being exemplary of substitutions of components that may be effected with respect to any of the other embodiments hereinbefore described as noted earlier in the specification.

Since certain changes may be made in the above apparatus without departing from the scope of the invention herein involved, it is intended that all material contained in the above description or shown in the accompanying drawing shall be interpreted in an illustrative and not in a limiting sense.

What is claimed is:

1. In apparatus for applying a test electrical surge from a surge generator to equipment under test, said apparatus comprising a coupler/filter for connecting said equipment to said generator and to electrical lines having at least high and low polar sides for connecting said equipment to a source of electrical line power, wherein said coupler/filter includes first inductive means having at least two portions connected in series in said high side of said electrical line, and second inductive means having at least two portions connected in series in said low side of said line, the improvement comprising:

means for dissipating at least the major portion of energy stored in said inductive means during said power surge so as to prevent application of said stored energy to said equipment; and said means for dissipating comprises first and second electrical power rectifier means connected to one another to form a first series string connected in parallel across said first inductive means, and third and fourth electrical power rectifier means connected to one another to form a second series string connected in parallel across said second inductive means, said rectifier means being poled so that substantially all of the energy stored in said inductive means due to application of said surge to said equipment cannot exit said inductive means except into appropriately poled ones of said rectifier means; and wherein said first and second rectifier means are connected in parallel with respective portions of said first inductive means, and said third and fourth rectifier means are each connected in parallel with respective portions of said second inductive means.

2. In apparatus as defined in claim 1 wherein said first and second rectifier means have like electrodes connected to one another, and said third and fourth rectifier means have like electrodes connected to one another.

3. In apparatus as defined in claim 2 including first switch means disposed for connecting the junction of said portions of said first inductive means to the like-connected electrodes of said first series string of rectifier means, second switch means disposed for connecting the junction of said portions of said second inductive means to the like-connected electrodes of said second series string of rectifiers, wherein said first and second switch means are ganged for like operation together.

4. In apparatus as defined in claim 3 including third switch means disposed for bridging one portion of said first inductive means, and fourth switch means disposed for bridging one portion of said second incductive means, said third and fourth switch means being ganged together for like operation and ganged with said first and second switch means for alternative operation therewith.

5. In apparatus as defined in claim 1 wherein said first and second rectifier means are connected anode-to-anode, and said third and fourth rectifier means are connected cathode-to-cathode.

6. Apparatus as defined in claim 1 wherein said coupler/filter comprises a single-phase filter.

7. Apparatus as defined in claim 6 wherein said coupler/filter includes a first capacitor connected from said high side to ground, a second capacitor connected from said low side to ground, and a third capacitor connected between said high and low sides of said electrical line.

8. Apparatus as defined in claim 1 wherein said coupler/filter is a polyphase filter.

9. Apparatus as defined in claim 1 including means for surge-coupling said generator between ground and either or both of said high and low sides of said electrical lines.

10. Apparatus as defined in claim 9 wherein said means for surge coupling comprises a pair of capacitors respectively connected between said generator and said high and low sides of said electrical lines.

11. Apparatus as defined in claim 1 wherein said coupler/filter comprises a three phase filter, said electrical lines comprising first, second, and third conductors, said coupler/filter including corresponding inductors in series with said first, second and third conductors.

12. Apparatus as defined in claim 11 including means coupling said surge generator between at least any two of said conductors.

13. Apparatus as defined in claim 11 wherein said coupler/fitter further comprises a neutral conductor and means coupling said surge generator between said first and said neutral conductors.

14. Apparatus as defined in claim 11 wherein said coupler/filter further comprises a neutral conductor and means coupling said surge generator between said neutral conductor and each of said first, second, and third conductors.

15. Apparatus as defined in claim 11 wherein said coupler/filter further comprises a neutral conductor and means coupling said surge generator from said neutral conductor and any of the others of said conductors.

16. Apparatus as defined in claim 11 wherein said coupler/filter further comprises a neutral conductor and means coupling said surge generator from said neutral conductor and each of the others of said conductors.

17. In apparatus as defined in claim 1 wherein each of said electrical power rectifier means comprises a series string of rectifiers or combinations of at least one Zener diode and at least one rectifier.

18. Apparatus for minimizing undershoot of test electrical power surges to be applied by a surge generator to equipment under test, said apparatus comprising, in combination:

a surge-back coupler/filter for coupling said equipment to an electrical line having at least high and low sides for connecting said equipment to a source of line power, said coupler/filter comprising at least a pair of inductive components respectively connected in said high and low sides; and a plurality of electrical power rectifier means each connected in parallel across respective ones of said inductive components and being poled so that substantially all of the energy stored in said inductive components due to application of said surges to said equipment cannot exit said inductive components except into said rectifier means;

wherein said electrical line comprises first, second and third conductors; said coupler/filter comprises a three-phase filter having respective ones of said inductive components disposed in series with said first, second and third conductors; and wherein each of said plurality of electrical power rectifier means includes:

a pair of rectifiers, each said pair being associated with a corresponding one of said inductive components, the rectifier of each said pair being poled for conduction in opposite directions to one another; and a like plurality of switching means each one coupled to a respective one of said pair of rectifiers and operable for mutually exclusively connecting either rectifier of its associated pair of rectifiers across said one of said associated inductive components.

19. In apparatus for applying a test electrical surge from a surge generator to equipment under test, said apparatus comprising a coupler/filter for connecting said equipment to said generator and to an electrical line having at least high and low polar sides for connecting said equipment to a source of electrical line power, the improvement wherein said coupler/filter includes:
first inductive means connected in series in said high side of said electrical line and formed of at least first and second inductors:
second inductive means connected in series in said low side of said electrical line and formed of at least third and fourth inductors:
said apparatus further including means for dissipating at least the major portion of the energy stored in said inductive means during said test surge so as to prevent application of said stored energy to said equipment, said means for dissipating comprising first and second electrical power rectifier means each respectively connected in series with said first and second inductors, and third and fourth electrical power rectifier means each respectively connected in series with said third and fourth inductors;
first switch means disposed for connecting the junction of said first rectifier means and said first inductor to the junction of said second rectifier means and said second inductor;
second switch means disposed for connecting the junction of said third rectifier means and said third inductor with the junction of said fourth rectifier means and said fourth inductor;
each of said rectifier means being poled so that substantially all of the energy stored in said inductive means due to application of said surges to said equipment cannot exit said inductive means except into said rectifier means.

20. In apparatus as defined in claim 19 wherein each of said electrical power rectifier means comprises a series string of rectifiers or combinations of at least one Zener diode and at least one rectifier.

21. Apparatus for minimizing undershoot of test electrical power surges to be applied by a surge generator to equipment under test, said apparatus comprising, in combination:
a surge-back coupler/filter for coupling said equipment to an electrical line having at least high and low sides for connecting said equipment to a source of line power, said coupler/filter comprising at least a pair of inductive components each respectively connected in series in said high and low sides; and
a plurality of electrical power rectifier means each including a pair of rectifiers poled for conduction in opposite directions to one another,
first switching means operable for mutually exclusively connecting either rectifier of one of said pairs across a first of said inductive components in parallel;
second switching means operable for mutually exclusively connecting either rectifier of the other of said pairs in parallel across a second of said inductive components
said rectifiers, when connected by said switching means, being poled so that substantially all of the energy stored in said inductive components due to application of said surges to said equipment cannot exit said inductive components except into said rectifier means.

22. In apparatus as defined in claim 21 wherein each of said electrical power rectifier means comprises a series string of rectifiers or combinations of at least one Zener diode and at least one rectifier.

23. Apparatus for minimizing undershoot of test electrical power surges to be applied by a surge generator to equipment under test, said apparatus comprising, in combination:
a surge-back coupler/filter for coupling said equipment to an electrical line having at least high and low sides for connecting said equipment to a source of line power, said coupler/filter comprising at least a pair of inductive components each respectively connected in series in said high and low sides; and
a plurality of electrical power rectifier means;
first switching means operable for mutually exclusively connecting a first of said rectifier means in oppositely poled configurations in parallel across a first of said inductive components; and a second switching means operable for mutually exclusively connecting a second of said rectifier means in oppositely poled configurations in parallel across a second of said inductive components;
said rectifier means, when connected by said switching means, being poled so that substantially all of the energy stored in said inductive components due to application of said surges to said equipment cannot exit said inductive components except into said rectifier means.

24. In apparatus as defined in claim 23 wherein each of said electrical power rectifier means comprises a series string of rectifiers or combinations of at least one Zener diode and at least one rectifier.

* * * * *

UNITED STATES PATENT AND TRADEMARK OFFICE
CERTIFICATE OF CORRECTION

PATENT NO. : 4,843,515
DATED : June 27, 1989
INVENTOR(S) : Peter L. Richman

It is certified that error appears in the above-identified patent and that said Letters Patent is hereby corrected as shown below:

Claim 4, column 13, line 43, delete "incductive" and substitute therefor -- inductive --;

Claim 13, column 14, line 10, delete "coupler/fitter" and substitute therefor -- coupler/filter --;

Claim 19, column 15, line 8, delete ":" and substitute therefor -- ; --;

Claim 19, column 15, line 11, delete ":" and substitute therefor -- ; --; and

Claim 21, column 16, line 11, after "components" insert -- ; --.

Signed and Sealed this

Twenty-seventh Day of March, 1990

Attest:

JEFFREY M. SAMUELS

*Attesting Officer*        *Acting Commissioner of Patents and Trademarks*